(12) United States Patent
Raphaeli et al.

(10) Patent No.: US 6,654,926 B1
(45) Date of Patent: Nov. 25, 2003

(54) SOFT DECISION MAXIMUM LIKELIHOOD ENCODER AND DECODER

(75) Inventors: Dan Raphaeli, Kfar Saba (IL); Gonen Barkan, Arad (IL)

(73) Assignee: Itran Communications Ltd., Beersheva (IL)

( * ) Notice: Subject to any disclaimer, the term of this patent is extended or adjusted under 35 U.S.C. 154(b) by 423 days.

(21) Appl. No.: 09/686,237

(22) Filed: Oct. 11, 2000

(51) Int. Cl.[7] .............................................. H03M 13/00
(52) U.S. Cl. ...................................... 714/780; 714/794
(58) Field of Search ................................ 714/780, 794; 375/341

(56) References Cited

U.S. PATENT DOCUMENTS

| | | | |
|---|---|---|---|
| 5,461,629 A | 10/1995 | Sutterlin et al. | 714/46 |
| 5,563,897 A | 10/1996 | Pyndiah et al. | 714/755 |
| 5,606,569 A | 2/1997 | MacDonald et al. | 714/758 |
| 6,064,695 A | 5/2000 | Raphaeli | 375/230 |

FOREIGN PATENT DOCUMENTS

FR 2778289 11/1999

OTHER PUBLICATIONS

Morozov et al. Modified CSK–system with discriminat procedure for signal processing, 2000, IEEE, p. 536–244.*
Abel et al., Maximum likelihood detection of symbolic dynamics in communication systems with chaos shift keying, May 2000, HOTBOT, p. 1–5.*
Mahmudi et al., On the implementation of soft decision decoding for RS codes, 2000, HOTBOT, p. 1–5.*
Havinga, Energy efficiency of error correction on wireless systems, 1999, Research Index, p. 1–14.*
McAuley, Reliable broadband communication using burst erasure correcting code, 1990, ACM, p. 297–306.*
Farrell et al., Soft decision error control for h.f. data transmission, Oct. 1980, IEE PRoc., vol. 127, Pt. F, No. 5, p. 389–400.*
Rubinoff, N–Dimensional codes for detecting and correcting multiple errors., Dec. 1967, ACM, p. 545–551.*
Andrew J. Viterbi, et al., Principles of Digital Communication and Coding, McGraw–Hill, Inc., 1979, pp. 3–35, 47–58, 82–96.
George C. Clark, Jr., et al., Error–Correction Coding for Digital Communications, Plenum Press, 1981, pp. 141–180, 227–266.

(List continued on next page.)

*Primary Examiner*—Christine T. Tu
*Assistant Examiner*—Shelly A Chase
(74) *Attorney, Agent, or Firm*—Howard Zaretsky

(57) ABSTRACT

A soft decision maximum likelihood detection method and apparatus. Both encoding and decoding schemes are provided for a forward error correcting code. The decoding technique utilizes soft decision maximum likelihood decoding especially suited for codes that operate on symbols rather than bits. The decoding technique utilizes a maximum likelihood function in combination with an erasure correcting coding scheme to correct b+1 errors in a block wherein the erasure correcting code itself can correct up to b erasures. The decoding method uses likelihood values for all possible symbol values for each received symbol in addition to hard decisions. First, the $(b+1)^{th}$ error is corrected by assuming a single error in each symbol location. Then, for each symbol in a codeword all valid symbol possibilities are tested. For each symbol possibility, the metric of the resulting codeword is calculated using the likelihoods provided by the receiver. The remaining b errors are corrected by assuming erasures in all possible combinations of b symbols. The codeword yielding the maximum metric is selected and subsequently decoded and output.

32 Claims, 5 Drawing Sheets

OTHER PUBLICATIONS

Blaum, et al., "Evenodd: An Efficient Scheme for Tolerating Double Disk Failures in RAID Architectures," IEEE Transactions on Computers, vol. 44, No. 2, pp. 192–201, Feb. 1995.

Dan Raphaeli, et al., U.S. patent application Ser. No. 09/551,449, filed Apr. 18, 2000, entitled "Receiver for Use In a Code Shift Keying Spread Spectrum Communications System".

J. Nilsson et al., "Comparison Between Different Soft Decoding Algorithms",Area Communication. Stockholm, Jun. 13–17, 1988, IEEE Proceedings of the European Conference on Electrotechnics, vol. Conf. 8, Jun. 13, 1988, pp. 177–180.

M. Blaum et al., "Evenodd: An Optimal Scheme for Tolerating Double Disk Failures in RAID Architectures", Proceedings of the Annual International Symposium on Computer Architecture, Chicago, Apr. 18–21, 1994, Los Alamitos, IEEE Comp. Soc. Press, vol. Symp. 21, Apr. 18, 1994, pp 245–254.

E. Berlekamp, "Bounded Distance + 1 Soft Decision Reed–Colomon Decoding", IEEE Transactions on Information Theory, IEEE Inc. New York, vol. 42, No. 3, May 1, 1996, pp. 704–720.

* cited by examiner

SOFT DECISION MAXIMUM LIKELIHOOD ENCODER AND DECODER

FIELD OF THE INVENTION

The present invention relates generally to data communication systems and more particularly relates to a soft decision decoder suitable for use in a code shift keying based direct sequence spread spectrum communication system.

BACKGROUND OF THE INVENTION

In recent years, the world has witnessed explosive growth in the demand for communications and networking and it is predicted that this demand will increase in the future. Many communication and networking schemes utilize some form of error correcting techniques to correct errors caused during transmission over noisy, non-ideal communication channels. The use of error detection and correcting codes has thus been widely used in various communications fields in order to improve the reliability of data transmission. In particular, a well-known class of error correcting code (ECC) schemes includes block codes and decoders that perform maximum likelihood detection decoding.

Block Coded Digital Communications and Maximum Likelihood Decoder

A block diagram illustrating a generalized digital communication system is shown in FIG. 1. The general digital communication system, generally referenced 10, comprises a transmitter 12 and receiver 14 connected via a channel 20. The data arrives at a rate of one bit every $T_s$ seconds and is stored until a block of K bits accumulates. The block is then input to the encoder 16 as one of M possible messages denoted $H_1, H_2, \ldots, H_M$ where $M=2^K$. The encoder performs a mapping from the input message to a signal $x_m$. The modulator 18 converts the signal $x_m$ to a signal of finite duration $T=KT_S$. Thus, a set of messages $\{H_m\}$ is mapped to a set of signals $\{x_m(t)\}$.

The goal of the channel encoder 16 is to perform a mapping from an input digital sequence to a channel input sequence and the goal of the channel decoder 24 is to perform a mapping from the channel output sequence to an output digital sequence. The encoder and decoder should be constructed so as to minimize the effect of channel noise, i.e. the differences between input and output digital sequences are minimized. In order to achieve this, redundancy is introduced in the channel encoder that is subsequently used by the decoder to reconstruct the input sequence as accurately as possible.

The signals are transmitted onto the channel 20 and received as y(t) at the receiver 14. The receiver comprises a demodulator 22 and decoder 24. In particular, the goal of the decoder is to perform a mapping from the vector y to a decision $H_{\hat{m}}$ on the message transmitted. A suitable criterion for this decision is to minimize the probability of error of the decision. The optimum decision rule, given the criterion is to minimize the error probability in mapping each vector y to a decision, can be expressed as $$H_{\hat{m}} = H_m \text{ if } Pr(H_m \text{sent}|y) \geq Pr(H_{m'} \text{sent}|y) \text{ for all } m' \neq m \quad (1)$$

The above condition can be expressed in terms of prior probabilities of the messages and in terms of the conditional probabilities of y given each $H_m$ that are called the likelihood functions. The optimum decision in Equation 1 can be expressed, using Bayes' rule, as $$H_{\hat{m}} = H_m \text{ if } \ln\pi_m + \sum_{n=1}^{N} \ln p(y_n | x_{mn}) > \quad (2)$$

$$\ln\pi_{m'} + \sum_{n=1}^{N} \ln p(y_n | x_{m'n}) \text{ for all } m' \neq m$$

where $x_{mn}$ represents the $n^{th}$ component (i.e. an individual bit) of the $m^{th}$ vector. Thus, the goal is the choose the output decision (i.e. codeword $H_m$) that yields a maximum.

In most cases, the message probabilities are all equal, thus $$\pi_m = \frac{1}{M} \; m = 1, 2, \ldots, M \quad (3)$$

Therefore the factors $\pi_m$, $\pi_{m'}$ can be eliminated from Equation 2. The resulting decision rule is then referred to as maximum likelihood. The maximum likelihood decoder depends only on the channel. Note that the logarithm of the likelihood function is commonly used as the metric. The maximum likelihood decoder thus functions to compute the metrics for each possible signal vector, compare them and decide in favor of the maximum.

Additional background information on coding and digital communications can be found in the book "Principles of Digital Communication and Coding," A. J. Viterbi and J. K. Omura, McGraw Hill, Inc., 1979.

Soft Decision Decoding

Soft decision decoding techniques are known in the art. Examples of well-known codes include Tornado code, Hamming code, Convolution Code, Turbo Code, Reed-Solomon Code and Arithmetic Code. The Hamming Code is a family of optimal binary ($2^n-1$, $2^n-1-n$) codes that is capable of correcting one error or three erasures. A disadvantage of this code is that it is a binary code and thus cannot take advantage of multi-bit symbol constellations associated with symbol codes. The convolution code is one of the best known soft decision codes that can be decoded using a Viterbi algorithm. A disadvantage of this code is that it is complex to implement in hardware and is not as effective for high code rates close to one.

Turbo codes (or parallel concatenated convolution codes) are more complex than convolution codes but provide better performance. Disadvantages of this code include relatively long decoding delays (i.e. very long codewords), complex decoding algorithm with large memory requirements and the fact that the code is a binary code and not a symbol code.

The Reed-Solomon code is a special case of the block Hamming Code. It is a symbol code (2-1, $2^n-1-2t$) capable of t error or 2t erasure corrections. A disadvantage in realizing this type of coder/decoder is the large amount of hardware required. In addition, it is relatively difficult to perform soft decision decoding with Reed Solomon codes.

Another well known coding technique is Wagner coding, in which encoding is performed by appending a single parity check bit to a block of k information bits. Upon reception of each received digit $r_i$, the a posteriori probabilities $p(0|r_i)$ and $p(1|r_i)$ are calculated and saved, and a hard bit decision is made on each of the k+1 digits. Parity is checked, and if satisfied, the k information bits are accepted. If parity fails, however, the received digit having the smallest different between its two a posteriori probabilities is inverted before the k information bits are accepted. In this case, a single erasure may be filled but no errors can be corrected.

A generalization of the Wagner coding technique applicable to any multiple error correcting (n, k) code is a scheme known as forced erasure decoding. The receiver, using such a scheme, makes a hard binary decision on each received bit as well as measures relative reliability. Note that in many communication systems, the probability of correct bit demodulation and decoding is monotonically related to the magnitude of the detected signal, i.e. the detected signal strength is a measure of bit reliability.

A disadvantage of the prior art soft decision decoding techniques is that they are intended for blocks of information made up of bits and not symbols. In addition, most require very large gate counts in order to realize the hardware circuitry needed to implement the code.

SUMMARY OF THE INVENTION

Accordingly, it is a general object of the present invention to provide a novel and useful soft decision maximum likelihood detection method, in which the problems described above are eliminated. The present invention comprises an encoder and decoder for a forward error correcting code. The decoding technique of the present invention utilizes soft decision maximum likelihood decoding that is especially suited for codes that operate on symbols rather than bits and is particularly well suited for short blocks, e.g., blocks consisting of tens of symbols.

The present invention comprises a decoding technique that utilizes a maximum likelihood function in combination with an erasure correcting coding scheme to correct multiple errors in a block. Note that in coding theory terminology, an erasure is an error whose location is known. The erasure correcting codes used with the decoding method of the present invention, are operative to correct b erasures in a receive block of length n symbols. The decoding method of the present invention is capable of correcting b+1 errors using any arbitrary code that is capable of correcting b erasures. The decoding method can correct more errors than erasures due to the use of additional information regarding the reliability of the received symbols together the with the hard decisions.

Any suitable erasure/error correcting code may be used with the decoding method of the present invention. Two example embodiments are provided, one that utilizes the Soft Diagonal Parity (SDP) code and another that utilizes the Even Odd Parity (EOP) code. The SDP code is capable of correcting a single erasure while the EOP code is capable of correcting two erasures. The method of encoding the soft decision error correcting code for both the SDP and EOP codes are also described.

The decoding method can be used with any modulation scheme that can provide likelihood values for all possible symbol values for each received symbol. In the case where the modulation scheme used comprises Code Shift Keying (CSK), the likelihood values provided by the receiver comprise correlation values and the symbol values comprise shift indexes. The receiver also provides the hard decisions (i.e. the index yielding the maximum correlation).

First, the $(b+1)^{th}$ error is corrected by assuming a certain value in each symbol location. Then, for each symbol in a codewords, all valid symbol possibilities are tested. For each symbol possibility, the metric of the resulting codeword is calculated using the likelihoods provided by the receiver. The remaining b errors are corrected by assuming erasures in all possible combinations of b symbols. For each combination of symbols, the b symbols are marked as erasures and corrected using the desired erasure correcting code, e.g., SDP, EOP, etc. The metric of the resulting codeword is also calculated. The codeword yielding the maximum metric (i.e. the codeword most likely to have been received) is selected and subsequently decoded and output.

There is thus provided in accordance with the present invention a method of soft decoding capable of correcting b+1 errors using a block erasure correcting code with the ability to correct b erasures, the method comprising the steps of receiving for each symbol in a block of n symbols, a set of symbol metrics wherein each possible symbol value has a metric associated therewith, and a hard decision metric, looping through all symbols in the block, and for each symbol, assuming the symbol is in error, testing K possible symbol values looping through all possible combinations of b symbols from among the remaining symbols, and for each combination of b symbols, marking the combination as erasures, correcting the erasures using the erasure correcting code, calculating the likelihood of the resulting codeword, selecting the codeword having a maximum likelihood associated therewith and wherein n, K and b are positive integers.

There is also provided in accordance with the present invention a full information set soft decision decoder for correcting b+1 errors using a block erasure correcting code with the ability to correct b erasures comprising a receiving mechanism for each symbol in a block of n symbols, a set of likelihoods wherein each possible symbol value has a likelihood associated therewith, and a hard decision equal to the symbol value corresponding to a maximum likelihood, a converter for converting the correlation values to log probability ratios, an erasure generator adapted to generate all possible combinations of erasure patterns, an erasure correction decoder adapted to correct the block in accordance with each erasure pattern generated, a likelihood generator for calculating the likelihood of the resulting codeword corresponding to each possible combination of erasure pattern, search means for determining the codeword yielding a maximum likelihood and a decoder mechanism operative to decode the codeword corresponding to a maximum likelihood.

There is further provided in accordance with the present invention a method of soft decoding capable of correcting b+1 errors using a block erasure correcting code with the ability to correct b erasures, the method comprising the steps of receiving a hard decision metric and a set of symbol metrics comprising a metric for each possible symbol value, assuming a single error in each symbol location, and for each symbol, calculating a first metric difference between the metric for a first trial symbol and the hard decision metric, assuming b erasures in the symbol, and for each of the b symbols, correcting the erasures using the erasure correcting code, calculating a second metric difference between the metric for a second trial symbol and the hard decision metric, summing the second method differences and the first metric difference to yield a sum of differences, selecting the codeword yielding a minimum sum of differences and wherein b is as positive integer.

In accordance with the present invention, there is also provided a method of generating a soft decision error correcting code, the method comprising the steps of initializing a parity symbol, receiving a block of data comprising n−1 symbols, and for each symbol, XORing the symbol with the parity symbol, rotating the parity symbol, including the resultant parity symbol as the $n^{th}$ symbol in the block and wherein n is a positive integer.

There is further provided in accordance with the present invention a method of generating a soft decision error correcting code, the method comprising the steps of initializing a horizontal parity symbol, initializing a diagonal parity symbol, receiving a block of data comprising a plurality of symbols, and for each symbol, XORing the symbol with the horizontal parity symbol, XORing the symbol with the diagonal parity symbol, rotating the diagonal parity symbol, calculating an 'S' bit from the data block, setting the diagonal parity symbol in accordance with the 'S' bit, appending the resultant horizontal parity symbol to the block and appending the resultant diagonal parity symbol to the block.

There is also provided in accordance with the present invention a communication apparatus coupled to channel comprising an encoder adapted to generate a soft decision code from a block of data received from a data source, a transmitter operative to transmit data including the soft decision code over the channel, a receiver operative to receive data from the communications channel and to generate a set of soft symbol metrics and a hard symbol metric for each symbol received, a soft decoder adapted to decode the received data so as to yield the original transmitted symbols, the soft decoder operative to receive the hard decision metric and the set of symbol metrics, assume a single error in each symbol location, and for each symbol, calculate a first metric difference between the metric for a first trial symbol and the hard decision metric, assume one or more erasures in the symbol, and for erased symbol, correct the erasures using the erasure correcting code, calculate a second metric difference between the metric for a second trial symbol and the hard decision metric, sum the second method differences and the first metric difference to yield a sum of differences and select the codeword yielding a minimum sum of differences.

There is thus provided in accordance with the present invention a method of soft decoding capable of correcting b+1 errors using a block erasure correcting code with the ability to correct b erasures, the method comprising the steps of receiving for each symbol in a block of n symbols, a set of symbol metrics wherein each possible symbol value has a metric associated therewith, and a hard decision metric, looping through all symbols in the block, and for each symbol, assuming the symbol is in error, testing K possible symbol values looping through all possible combinations of b symbols from among the remaining symbols, and for each combination of b symbols, marking the combination as erasures, correcting the erasures using the erasure correcting code, calculating the likelihood of the resulting codeword, selecting the codeword having a maximum likelihood associated therewith and wherein n, K and b are positive integers.

There is also provided in accordance with the present invention a full information set soft decision decoder for correcting b+1 errors using a block erasure correcting code with the ability to correct b erasures comprising a receiving mechanism for each symbol in a block of n symbols, a set of likelihoods wherein each possible symbol value has a likelihood associated therewith, and a hard decision equal to the symbol value corresponding to a maximum likelihood, a converter for converting the correlation values to log probability ratios, an erasure generator adapted to generate all possible combinations of erasure patterns, an erasure correction decoder adapted to correct the block in accordance with each erasure pattern generated, a likelihood generator for calculating the likelihood of the resulting codeword corresponding to each possible combination of erasure pattern, search means for determining the codeword yielding a maximum likelihood and a decoder mechanism operative to decode the codeword corresponding to a maximum likelihood.

There is further provided in accordance with the present invention a method of soft decoding capable of correcting b+1 errors using a block erasure correcting code with the ability to correct b erasures, the method comprising the steps of receiving a hard decision metric and a set of symbol metrics comprising a metric for each possible symbol value, assuming a single error in each symbol location; and for each symbol, calculating a first metric difference between the metric for a first trial symbol and the hard decision metric, assuming b erasures in the symbol; and for each of the b symbols, correcting the erasures using the erasure correcting code, calculating a second metric difference between the metric for a second trial symbol and the hard decision metric, summing the second method differences and the first metric difference to yield a sum of differences, selecting the codeword yielding a minimum sum of differences and wherein b is as positive integer.

There is still further provided in accordance with the present invention a method of generating a soft decision error correcting code, the method comprising the steps of initializing a parity symbol, receiving a block of data comprising n−1 symbols; and for each symbol, XORing the symbol with the parity symbol, rotating the parity symbol, including the resultant parity symbol as the $n^{th}$ symbol in the block and wherein n is a positive integer.

There is also provided in accordance with the present invention a method of generating a soft decision error correcting code, the method comprising the steps of initializing a horizontal parity symbol, initializing a diagonal parity symbol, receiving a block of data comprising a plurality of symbols; and for each symbol, XORing the symbol with the horizontal parity symbol, XORing the symbol with the diagonal parity symbol, rotating the diagonal parity symbol, calculating an 'S' bit from the data block, setting the diagonal parity symbol in accordance with the 'S' bit, appending the resultant horizontal parity symbol to the block and appending the resultant diagonal parity symbol to the block.

In addition, there is provided in accordance with the present invention a communication apparatus coupled to channel comprising an encoder adapted to generate a soft decision code from a block of data received from a data source, a transmitter operative to transmit data including the soft decision code over the channel, a receiver operative to receive data from the communications channel and to generate a set of soft symbol metrics and a hard symbol metric for each symbol received, a soft decoder adapted to decode the received data so as to yield the original transmitted symbols, the soft decoder operative to receive the hard decision metric and the set of symbol metrics, assume a single error in each symbol location; and for each symbol, calculate a first metric difference between the metric for a first trial symbol and the hard decision metric, assume one or more erasures in the symbol; and for an erased symbol, correct the erasures using the erasure correcting code, calculate a second metric difference between the metric for a second trial symbol and the hard decision metric, sum the second method differences and the first metric difference to yield a sum of differences and select the codeword yielding a minimum sum of differences.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

Figure 1:
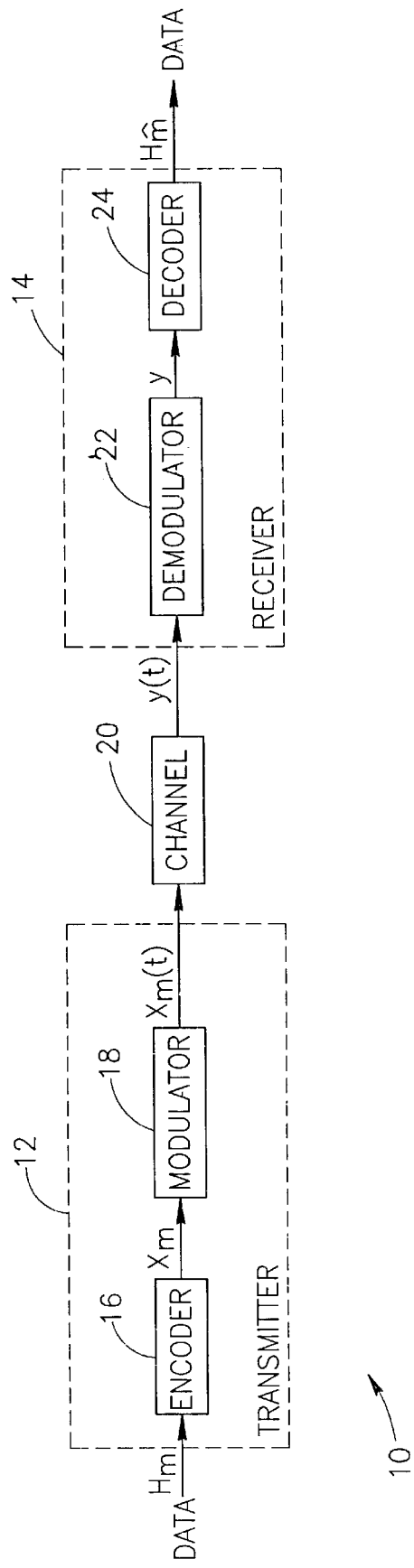
FIG. 1 is a block diagram illustrating a generalized digital communication system.

The following notation is used throughout this document.

| Term | Definition |
| --- | --- |
| AC | Alternating Current |
| ACSK | Adaptive Code Shift Keying |
| BPF | Band Pass Filter |
| CSK | Code Shift Keying |
| DP | Diagonal Parity |
| ECC | Error/Erasure Correcting Code |
| ENR | Energy to Noise Ratio |
| EOP | Even Odd Parity |
| HP | Horizontal Parity |
| ISD | Information Set Decoding |
| LSB | Least Significant Bit |
| MAC | Media Access Control |
| MPSK | M'ary Phase Shift Keying |
| MSB | Most Significant Bit |
| MSD | Maximum Separable Distance |
| PLL | Phase Lock Loop |
| RAM | Random Access Memory |
| SDP | Soft Diagonal Parity |
| SER | Symbol Error Rate |
| UST | Unit Symbol Time |

Detailed Description of the Invention

The present invention is an encoder and decoder for a forward error correcting code. The decoding technique of the present invention utilizes soft decision maximum likelihood decoding that is especially suited for codes that operate on symbols rather than bits and is particularly well suited for short blocks, e.g., tens of symbols or less. The code is able to correct blocks received having multiple errors and erasures.

A feature of the soft decision decoding scheme of the present invention is that erasure correcting capability can be traded for error correcting capability. For example, if the error correcting code can correct one erasure given a hard decision, the decoder of the present invention can be adapted to correct at least a single error and in most cases,.more than one error. For example, the code presented herein is capable of correcting two symbol errors thus giving the code the ability to correct multiple bits per symbol.

To aid in understanding the principles of the present invention, the decoding technique is presented in the context of a direct sequence spread spectrum receiver for use in a communication system that utilizes a modulation technique referred to as code shift keying (CSK). Use of CSK modulation increases the number of bits transmitted per symbol, decreases synchronization requirements and improves communication performance. Code shift keying modulation transmits data in the form of circularly rotated spreading waveforms that may comprise any type of waveform that has suitable auto correlation properties such as a chirp or PN sequence. The CSK data communications system is applicable to numerous environments but is particularly applicable to relatively noisy environments such as the AC powerline.

In a CSK transmission system, the spreading waveform shown spans a time duration that is termed a unit symbol time (UST). During each symbol period or UST, a plurality of bits are transmitted. The symbol period is divided into a plurality of shift indexes with each shift index representing a particular bit pattern. The spreading waveform is rotated by an amount in accordance with the data to be transmitted. The data is conveyed in the amount of rotation applied to the chirp before it is transmitted. Alternatively, the data may be conveyed in the shift differential between consecutive symbols. Typically, the chirp comprises a swept frequency signal. For example, the frequency sweep can span from 20 to 80 MHz or from 100 to 400 KHz.

A more detailed description of the CSK transmission system is provided in U.S. Pat. No. 6,064,695, entitled "Spread Spectrum Communication System Utilizing Differential Code Shift Keying," similarly assigned and incorporated herein by reference in its entirety.

CSK Receiver

Figure 2:
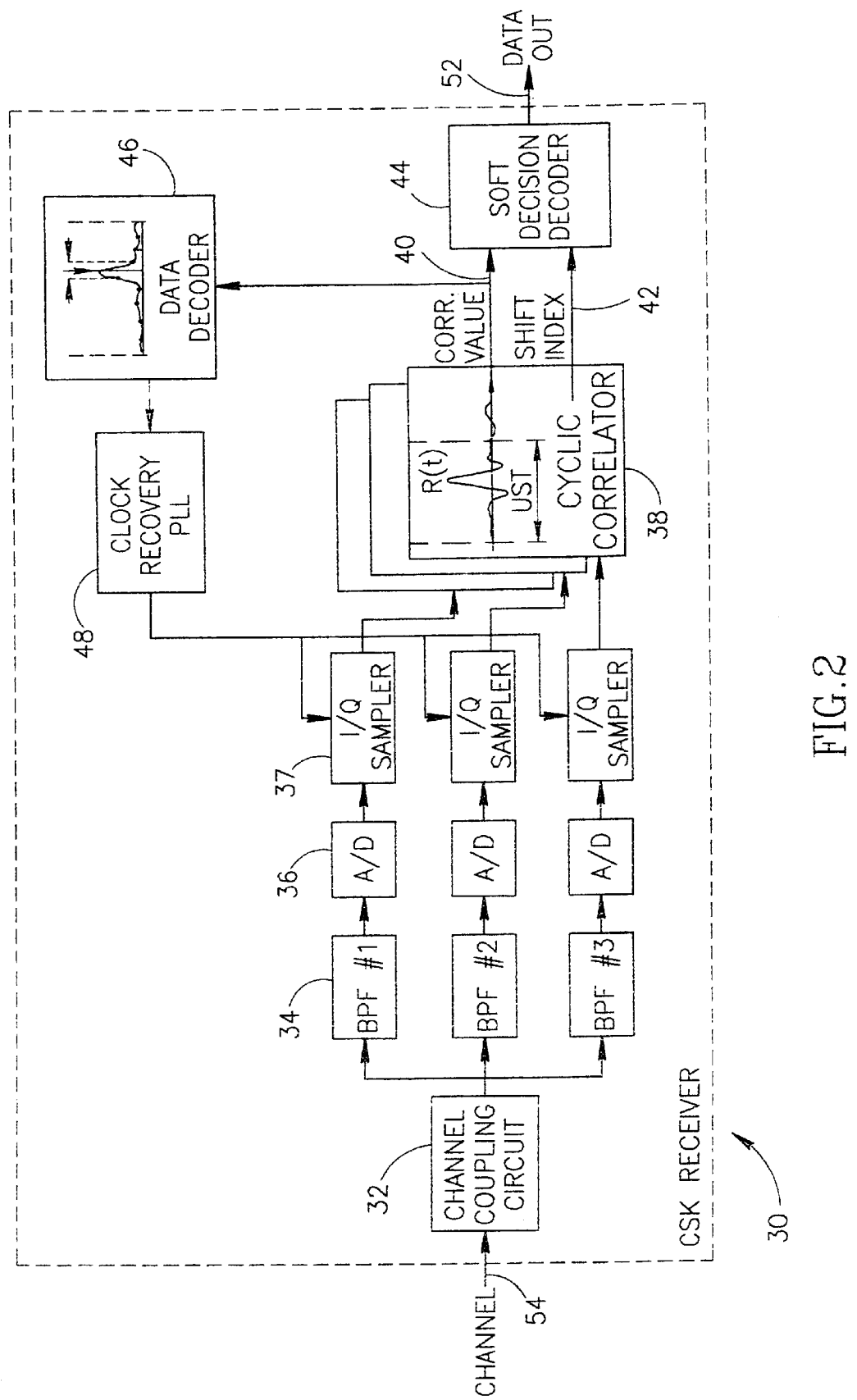
FIG. 2 is a block diagram illustrating a CSK receiver incorporating the soft decision decoder of the present invention.

An example CSK receiver that may incorporate the error correcting code method of the present invention will now be described in more detail. A block diagram illustrating a CSK receiver incorporating the soft decision decoder of the present invention is shown in FIG. 2. A detailed description of the CSK receiver can be found in U.S. application Ser. No. 09/551,449, filed on Apr. 18, 2000, entitled "A Receiver For Use In A Code Shift Keying Spread Spectrum Communications System," similarly assigned and incorporated herein by reference in its entirety. A brief description is presented below.

The CSK receiver, generally referenced 30, comprises channel coupling circuitry 32, a band pass filter (BPF) bank 34, A/D converters 36, I/Q samplers 37, a plurality of complex cyclic correlators 38 and soft decision decoder 44. The receiver 30 also comprises a data decoder 46 and clock recovery phase locked loop (PLL) 48.

The signal from the channel 54 is input to the channel coupling circuit 32 which functions as the analog front end for the receiver. The signal output of the channel coupling circuitry 32 is input to three band pass filters 34, labeled BPF #1 through BPF #3. The three BPFs are constructed to cover a suitable frequency range such as 4 to 20 MHz. In this case, band pass filter #1 covers the frequency range of band #1 (4 to 9 MHz), band pass filter #2 covers the frequency range for band #2 (9 to 15 MHz) and band pass filter #3 covers the frequency range for band #3 (15 to 20 MHz).

Note that in an alternative embodiment, the spreading waveform may comprise other frequency ranges in addition to a different number of bands. Note that, preferably the number of bands is two or greater in order to achieve an increase in reliability. In the case of three bands, two of the bands can be corrupted with noise and fail to receive and the receiver logic of the remaining band may still be able to output correct data. In addition, the splitting of the received signal to three bands has the advantage of making the receiver more immune to phase distortions. The amount of distortion that each band can handle does not change but the contribution from all three bands working together increases the amount of phase distortion the receiver can handle and still receive properly.

The output of each band pass filter is input to a one bit A/D converter 36. Note that the A/D converter may comprise an A/D of any suitable width. In the example presented herein, the A/D comprises a one bit A/D converter. The one bit A/D converter may comprise a comparator to compare the input with the average value of the input signal followed by a sampler clocked at the appropriate sampling frequency. Note that the output of the A/D converter may comprise other bit lengths as well. The sampling rate $f_s$ in the example receiver presented herein is 16 MHz. The center frequency $f_c$ for each of the bands #1, #2, #3 is 8, 12 and 16 MHz, respectively.

The binary output of each of the one bit A/D converters is sampled by I/Q samplers 37 at the sampling frequency $f_s$ forming an I and Q data stream. The Q samples are generated by sampling at the sampling frequency $f_s$ after being delayed a period of $1/4f_c$ by a delay circuit (not shown) the output of which forms a 90 degree quadrature Q bit stream. Each of the I and Q data streams within each band are input to a complex cyclic correlator 38 which functions to correlate the input data with a template. The complex correlation function is operative to detect the amount of rotation in the symbol. The received data is clocked into a shift register and circularly rotated. For each rotation shift, the correlator generates a correlation sum. The correlation results for both the I and Q data streams are summed over each band to yield a correlation sum 40 and corresponding shift index 42, both of which are input to the soft decision decoder 44. In the case of Adaptive CSK a sign bit is also input to the decoder. The soft decision decoder performs the decoding method of the present invention to yield the original transmitted data. Note that the cyclic correlator is adapted to make available to the soft decision decoder the correlation result generated at each relative rotation of the template and the received symbol.

The correlation sum 40 is also input to data decoder 46 which functions to find the peak in the correlation sum. The peak is used by the clock recovery PLL circuit 48 to derive the clock timing for the A/D converters 36 and I/Q samplers 37. The peak index is chosen corresponding to a maximum correlation sum. A shift index is chosen during each UST corresponding to the shift index that yields the maximum correlation sum. This shift index represents the original rotation applied to the transmitted symbol. The shift index represents the hard decision and is input to the soft decision decoder where it is used in the decoding process.

Decoding Using Maximum Likelihood Function and Erasure Correcting Code

The present invention comprises a decoding technique that utilizes a maximum likelihood function in combination with an erasure correcting coding scheme to correct multiple errors in a block. Note that in coding theory terminology, an erasure is an error whose location is known. Any suitable erasure/error correcting code may be used with the decoding method of the present invention.

Assume that the length of a block for any arbitrary erasure correcting code used comprises n symbols. In addition, assume that the code is operative to correct b erasures. Typically, a code is able to correct more erasures than errors because in the case of erasures, the decoder is given knowledge of the location of the errors.

The decoding method of the present invention is capable of correcting b+1 errors using any arbitrary code that is capable of correcting b erasures. The decoding method can correct more errors than erasures due to the use of additional information regarding the reliability of the received symbols together with the hard decisions. In the CSK receiver example presented herein, the additional information comprises the correlation sum information in addition to the hard decisions (i.e. the index yielding the maximum correlation).

Each symbol within a block (also referred to as a codeword) can have a value in the range 0 . . . M−1. For example, a symbol comprising 7 bits can have one of M=128 values. In the case of CSK transmission, this corresponds to 128 possible shift indexes for each symbol, or 64 shift indexes and sign information. Note that in accordance with the present invention, the soft decision decoder is adapted to receive a value that corresponds to the probability of the symbol being a particular value. Thus, the decoder is adapted to store in memory a metric for each possible value of each symbol. This corresponds to storing the correlation value for each possible shift index of a symbol. As a tradeoff with optimality, it is sufficient to store only a portion of this information using some means of information compression to reduce the size of the required memory.

Therefore, for each symbol i a plurality of M metrics are generated and stored in memory. Each metric represents the likelihood of the symbol being the value p. A vector of metrics (i.e. likelihood values) are generated and stored in memory for each received symbol. The resulting two dimensional array is denoted by f(i, p) wherein the first index i is the location of the symbol within the codeword and the second index p is the value of the symbol. The first index i ranges from 0 to n−1 while the second index p ranges from 0 to M−1. The elements of the array comprise the symbol metrics wherein each metric corresponds to the likelihood (i.e. probability) of the $i^{th}$ symbol in the codeword having a value p. Note that the receiver provides the metrics to the soft decision decoder as correlation values and corresponding shift indexes.

In accordance with the decoding method of the present invention, a maximum likelihood function is used to determine the most likely codeword received. The maximum likelihood function can be expressed mathematically as follows $$\max_{m \in C} \sum_{i=0}^{n-1} f(i, m_i) \tag{4}$$

where
   m represents a single codeword;
   $m_i$ represents the $i^{th}$ symbol of codeword m;
   C represents the set of all possible codewords; and
   n is the number of symbols in a codeword.

The maximization is carried out over all possible codewords C. The decoding technique of the present invention utilizes the maximum likelihood detection expressed above in Equation 4 with some modifications to reduce complexity and computation time. In accordance with the invention, to reduce the computation time considerably, the search for the most likely codeword is performed using a smaller set of possible symbols. Depending on the processing resources available and the time constraints of the system, it may not be practical to search over all possible symbols. Consider, for example, a codeword made up of six data symbols, each symbol comprising seven bits. The number of possible symbol combinations (i.e. codewords) is then $128^6$, which is too large a number to search for most practical implementations, both in terms of hardware requirements and processing time constraints.

In accordance with the soft decision decoding method of the present invention, b+1 errors can be corrected where b represents the number of erasures that the code used can correct. Let the shift index yielding the maximum correlation in a symbol i be denoted by $g_i$, which is referred to as the hard decision. The decoding method is operative to test all (or alternatively less than all) combinations of b+1 errors. Less than all combinations of b+1 errors yields a further reduction in decoder complexity. In the case where b=2, for example, the decoder can correct three errors. In operation, the decoder tests all combinations of three errors in the received block.

A manipulation to the maximum likelihood expression in Equation 4 reduces the complexity of the computations required to find the optimum soft decision. A constant is added to the maximum likelihood function without affecting its maximization as shown below in Equation 5.

$$\min_{m \in C} \left( \sum_{i=0}^{n-1} f(i, g_i) - \sum_{i=0}^{n-1} f(i, m_i) \right) \quad (5)$$

The first term represents the sum of the hard decisions (i.e. the maximum correlation values) over all the symbols that is a constant for all proposed $m_i$'s to be tried since it is not dependent on m. Therefore, it can be added without affecting the codeword chosen as optimal. Note that the number of additions can be reduced due to the fact that the maximum likelihood sum of the unchanged symbols yields the hard decision. Further, inverting the sign of the second term converts the maximization operation into a minimization operation.

Let the indexes of the b+1 locations that are tested be denoted by $\Lambda = j_0, j_1, j_2, \ldots, j_b$ where b is in the range of 0 ... n-1. The remaining n-(b+1) locations remain unchanged, therefore $m_i = g_i$ and they cancel each other out in the expression. Thus, Equation 5 reduces to $$\min \sum_{i \in \Lambda} [f(i, g_i) - f(i, m_i)] \quad (6)$$

In one example embodiment presented below, b=1 and in another, b=2. Thus, the number of locations to be tested in the first example is equal to two and in the second is equal to three.

Using the notation introduced above, the term $m_{j0}$ is cycled through all possible symbols ranging from 0 ... M−1. For each possible codeword, the likelihood is calculated using Equation 6 above. This first loop represents the first unknown symbol while b unknown symbols remain. In order to determine the b unknown symbols, they are marked as erasures and the erasure correcting algorithm of the chosen code is performed. The likelihood of the resulting codeword is calculated. Both likelihoods are summed and the codeword yielding the minimum is selected as the output.

The following pseudo code shown in Listing 1 below illustrates the decoding method of the present invention in more detail.

---

Listing 1: Decoding Method Using Maximum Likelihood in Combination with Erasure Correcting Code (using Equation 6)

```
/* correct the (b+1)th error assuming a single error in each symbol location */
for each symbol in a codeword;
        test all valid symbol possibilities;
        for each symbol possibility;
                calculate the difference between the metric for this symbol possibility
                (i.e. the trial symbol) and the hard decision metric;
                store the resulting metric-difference calculation (metric_difference #1);
/* correct the remaining b errors assuming b erasures in all possible combinations */
                for each combination of b symbols among the remaining symbols;
                        mark the b symbols as erasures and correct using the erasure
                        correcting code;
                    for each of the b symbols;
                        calculate the metric difference between the symbol (or trial)
                        metric and the corresponding hard decision metric;
                        sum the metric differences for the b symbols; and
                        store the resulting metric difference calculation
                        (metric_difference #2);
                    end for;
                end for;
        sum metric_difference #1 and metric_difference #2;
        store the sum;
        end for;
choose the codeword corresponding to the minimum sum as the decoder output;
```

---

For each block received, the decoder first loops through all symbol locations. For each symbol, all possible symbol values are tested and the metric difference between the metric for this symbol possibility (i.e. trial symbol) and the hard decision metric is calculated. The resulting metric difference calculation is stored.

Then, from the remaining symbols, all possible combinations of b symbols are looped through. For each combination, the b symbols are marked as erasures. The erasures are corrected using the particular erasure correcting code and the likelihood of the resulting codeword is calculated. Note that the resulting symbol values making up the codeword will necessarily satisfy the parity equations associated with the particular erasure correcting code. The computed metric for each of the b symbols is subtracted from the hard decision metric of that symbol. In accordance with Equation 6, all the metric difference calculations are added together along with the metric differences previously calculated in connection with the $(b+1)^{th}$ error.

The likelihood associated with a particular codeword is thus calculated using Equation 6 above. In this case, the codeword corresponding to the minimum sum rather than the maximum is chosen as the optimum soft decision. A likelihood value is obtained for each possible codeword tested. Note that each valid codeword is composed of n−(b+1) unchanged symbols whose values comprise the hard decisions and b+1 symbols whose proposed values replace the hard decisions at these locations.

In accordance with the present invention, the range of $j_0$ is limited to the K largest metrics for that symbol in order to greatly reduce the number of computations required. Limiting the range of symbol possibilities to the K largest metrics is justified since if the symbol corresponding to the largest metric is not correct, then it is highly probable that the correct symbol is the one that corresponds to the second, largest metric, and so on.

Depending on the processing resources available, this may result in a large reduction in the processing time required. As a result of the reduced computations, the system may be able to tolerate the time delay resulting from the serial use of the same hardware circuit. Alternatively, the reduced computation requirement may enable a parallel hardware implementation.

Note that it has been found that most cases, limiting the range of $j_0$ causes little degradation in the performance of the decoder. Through simulation and experimentation, it has been found that a value of K=2 is a good compromise that yields satisfactory performance while sacrificing very little optimality. In the CSK modulation scheme presented herein, the two metrics correspond to the first and second largest correlation sums.

Note that the case whereby the symbol is assumed to be the first maximum is equivalent to the case of testing for only b errors. This is because the K largest metrics are tried for the first symbol. Since one of the metrics is the largest, it can be considered the hard decision. Thus, it is assumed that this symbol is not in error. Consequently, there remain b errors left to correct.

Note also that the correlation sums for all possible shift indexes for each received symbol are still required for purposes of calculating the likelihood of the codeword resulting from the correction of the b erasures by the erasure correcting code.

In accordance with the decoder of the present invention, two example embodiments are presented that utilize the maximum likelihood decoding technique described hereinabove. The first embodiment is termed Soft Diagonal Parity (SDP) and the second is termed Even Odd Parity (EOP). The SDP embodiment is described first followed by the EOP embodiment.

Maximum Likelihood Decoding Using Soft Diagonal Parity

The Soft Diagonal Parity (SDP) is an erasure correcting code capable of correcting one erasure (b=1). Thus, using the SDP erasure correcting code, the decoding method of the present invention is capable of correcting two errors in a block. The encoder and decoder for the SDP code utilizes only exclusive OR (XOR) functions making it relatively easy to implement in hardware.

Assume that each symbol comprises n bits and that a block comprises n symbols, thus making the block square. Of the n symbols in a block, n−1 symbols are information symbols and one is a parity symbol. The parity symbol is obtained by XORing all the information symbols along the diagonal, i.e. each bit in the parity symbol is the parity of the bits in a particular diagonal. An example for the case of n=5 is shown below in Table 1. In this example, there are 4 information symbols, each symbol comprising 5 bits. Note that the block size n can be any size and is not limited to the example presented below.

TABLE 1

Soft Diagonal Parity Example n = 5

| | Bit #0 | Bit #1 | Bit #2 | Bit #3 | Bit #4 |
|---|---|---|---|---|---|
| Data symbol #0 | A | B | C | D | E |
| Data symbol #1 | E | A | B | C | D |
| Data symbol #2 | D | E | A | B | C |
| Data symbol #3 | C | D | E | A | B |
| Parity symbol | $P_B$ | $P_C$ | $P_D$ | $P_E$ | $P_A$ |

Each row of the table represents a symbol and each column represents the bits of the symbol. The last row is the parity symbol. Letters have been placed in the table elements to aid in understanding the bits used to generate the diagonal parity. Equations for each of the bits of the parity symbol is given below. The bits of the array are denoted by $a_{ij}$ where 'i' represents the row and 'j' the column wherein $0 \leq i \leq n-1$ and $0 \leq j \leq n-1$.

$$a_{4,0} = P_B = a_{0,1} \oplus a_{1,2} \oplus a_{2,3} \oplus a_{3,4}$$

$$a_{4,1} = P_C = a_{0,2} \oplus a_{1,3} \oplus a_{2,4} \oplus a_{3,0}$$

$$a_{4,2} = P_D = a_{0,3} \oplus a_{1,4} \oplus a_{2,0} \oplus a_{3,1}$$

$$a_{4,3} = P_E = a_{0,4} \oplus a_{1,0} \oplus a_{2,1} \oplus a_{3,2}$$

$$a_{4,4} = P_A = a_{0,0} \oplus a_{1,1} \oplus a_{2,2} \oplus a_{3,3}$$

wherein the '$\oplus$' symbol denotes the XOR operation. Note that the above equations realize EVEN parity for the bits of the parity symbol.

An advantage of generating the parity bits based on diagonal XORing of the bits is that no two lsb's are checked with the same parity bit. This is advantageous in the case where the lsb's are more vulnerable to errors than the higher order bits. Errors in the lsb's may be more probable due to synchronization timing jitter or the channel filtering effect. In these cases, using diagonal parity ensures that no two lsb's are checked with the same parity bit.

The application of the decoding method of the present invention to the Soft Diagonal Parity erasure correcting code will now be described in more detail. The method implements the reduction in the number of test symbol possibilities to K=2. Thus, the largest metric and the second largest metric are used. The code is combined with the use of M'ary bi-orthogonal modulation such as the CSK modulation scheme described hereinabove with one sign bit transmitted in the phase of the symbol. The sign bit is designated as the msb of the received symbol.

Two counters, 'j' and 'k' are used to loop over all possible combinations of two assumed symbol errors. The case where j=k, represents the case where only one error is assumed. Note that this case is identical to the case of two tested symbols in which one of the symbols is assumed equal to the hard decision. When j≠k, the symbol in the $k^{th}$ position is assumed to be the shift index corresponding to the second maximum metric (i.e. correlation sum). In other words, the $k^{th}$ symbol location is assumed to be in error. The $j^{th}$ symbol is then marked as an erasure and its shift index (i.e. symbol value) is calculated from the remaining symbols in combination with the $k^{th}$ symbol using the SDP code (i.e. diagonally XORing the symbols).

The shift index (i.e. the symbol value), excluding the sign bit, of the symbol in the $k^{th}$ position is stored in the variable 'm1' and the shift index (i.e. symbol value) of the symbol in the $j^{th}$ position is stored in the variable 'm'.

For each symbol assumed to be in error, the metric difference from the peak correlation is added in accordance with Equation 6 above. The shift indexes of the symbols which minimize this equation are stored in the variables save_m and save_m1, and the corresponding locations are stored in save_j and save_k, respectively.

The following pseudo code shown in Listing 2 below illustrates the encoding method of the SDP code in more detail. The encoding method is performed in the transmitter.

---
Listing 2: Encoding Method: Soft Diagonal Parity Code
---

```
s=0;
for (i=0; i < n-1; i++) {;
    x=data[i];
    s^=x;
    ror(s);
}
```

Note that the array 'data' holds the information symbols of the block to be encoded. The final value of the variable 's' represents the parity symbol. The 'ror' function is operative to cyclically shift (i.e. rotate) a value right over a limited number of bits, e.g., n bits.

The following C code shown in Listing 3 below illustrates the decoding method of the SDP code in more detail. The decoding method is performed in the receiver. The following data variables are used in the code:

uncoded_data[i]—holds the symbol value (i.e. shift index) corresponding to the maximum metric which is the hard decision $g_i$ (i.e. the maximum correlation sum) for each symbol 'i' in the block.

second[i]—holds the symbol value (i.e. shift index) corresponding to the second largest metric for each symbol 'i' in the block.

x[k][p]—the array of metric values where k is the location of the symbol in the block and p is the shift index. Note that the values in array 'x' are signed (i.e. they may be positive or negative).

mx[i]—the value of the maximum metric for each symbol i; in other words mx[i]=abs(x[i][uncoded_data[i]]).

---
Listing 3: Decoding Method: Soft Diagonal Parity Code
---

```
// first check to see if there is an error
s=0;
for (i=0; i < n-1; i++) {;
    s^=uncoded_data[i];
    ror(s);
}
if(s==0) return; // if there is no error than return
min = 100000 // a sufficiently big number, bigger than all expected values to be tested
for (k=0; k<n; k++) {
    j=k;
    for (jj=0; jj<n; jj++; j=(j+1)%n) {
        if (j==k) {
            m1=second[k];
            ram_out=x[k][m1];
            s1=sign(ram_out);   // extract the sign bit
// compute the difference between the maximum and second largest metric
            mx_minus_cand=mx[k]-abs(ram_out);
            xx1=second[k]+((s1+1)/2)*(2^(n-1));/ add the sign bit as msb
            xx=uncoded_data[k];
// XOR all the symbols with the current one thereby removing it
            m=(s^xx)%(2^(n-1));
            s1=((s^xx)/(2^(n-1)))*2-1;
            s_temp=s^xx1^xx;
            ror(s);
        }
        else {
            xx=uncoded_data[j];
            m=(s_temp^xx)%(2^(n-1)); // get the symbol without a sign bit
            s1=((s_temp^xx)/(2^(n-1)))*2-1; // get the sign bit
        }
        ror(s_temp);
// compute the different between the maximum and the tested metric for symbol j
        y=mx[j]-x[j][m]*s1;
        if (j != k)
// if 2 errors are tested, the difference between the second maximum and the
// maximum in the second symbol tested, i.e. symbol k, is also added
            tmp=y+mx_minus_cand;
        else
            tmp=y;
        if (tmp<min) {
```

-continued

Listing 3: Decoding Method: Soft Diagonal Parity Code

```
                    min=tmp; // set a new minimum
                    save_m=m;
                    save_m1=m1;
// if j equals k, there is no meaning to the second error m1
                    save_j=j;
                    save_k=k; // ignore if j equals k
                }
            }
    }
}
```

The resulting values of j and k are used to correct the errors by replacing the symbols at the j and k positions in the block with the values m and m1, respectively. Note that if j equals k, the results m1 and k are ignored.

Maximum Likelihood Decoding Using Even Odd Parity

The Even Odd Parity (EOP) is an erasure correcting code capable of correcting two erasures (b=2). Thus, using the EOP erasure correcting code, the decoding method of the present invention is capable of correcting three errors in a block. The encoder and decoder for the EOP code utilizes only exclusive OR (XOR) functions making it relatively easy to implement in hardware.

The Even Odd Parity application of the decoding method of the present invention is based on the well known EVENODD method of correcting two erasures described in the article "EVENODD: An Efficient Scheme for Tolerating Double Disk Failures in RAID Architecture," M. Blaum, J. Brady, J. Bruck, J. Menon, IEEE Transactions on Computers, Vol. 44, No. 2, February 1995, incorporated herein by reference in its entirety. The scheme is described briefly below.

The EVENODD scheme was originally developed for correcting up to two disk failures in a RAID array but can be applied to other systems using relatively large symbols and relatively short codes as in the CSK modulation scheme described above. A basic assumption made by the scheme is that there are m+2 symbols with the first m symbols being the information symbols and the last two symbols carrying the redundant parity data. The number m of information symbols must be a prime number. Blocks can be padded with zero information symbols to accommodate a number of information symbols that are not prime. In addition, it is assumed that each symbol comprises m−1 bits. The code may subsequently be combined with M'ary bi-orthogonal modulation such as the CSK modulation scheme described hereinabove.

Information symbols are encoded using two types of redundancy including horizontal and diagonal redundancy. The parity bits in the first parity symbol represent the horizontal XOR of the information symbols. The second parity symbol, which carries the diagonal redundancy, may be even or odd depending on an 'S' bit which determines the parity of the diagonal. If the diagonal has an even number of 1's, then the diagonals have even parity and vice versa, hence the name of the scheme.

The encoding procedure is defined by the equations below including the equation for determining the S bit. The equations below use the following notation defined in the reference above. Let $(n)_m=j$ if and only if $j=n(\mod m)$ and $0 \leq j \leq m-1$. For example, $(7)_5=2$ and $(-2)_5=3$. It is also assumed that there is an imaginary 0-row after the last row i.e., $a_{m-1,j}=0$, $0 \leq j \leq m-1$. Note that the array is now an m×(m+2) array. Let $$S = \bigoplus_{t=1}^{m-1} a_{m-1-t,t} \tag{7}$$

Then, for each l, $0 \leq l \leq m-2$, the redundant bits are obtained as follows $$a_{l,m} = \bigoplus_{t=1}^{m-1} a_{l,t} \tag{8}$$

$$a_{l,m+1} = S \oplus \left( \bigoplus_{t=0}^{m-1} a_{\langle l-t \rangle_m, t} \right) \tag{9}$$

Equations 8 and 9 above define the encoding with Equation 8 defining the horizontal parity and Equation 9 the diagonal parity. The resulting (m−1)×(m+2) array is able to recover the information lost in any two columns, i.e. the minimum distance of the code is three.

The encoding process is illustrated graphically by Tables 2 and 3 below. Table 2 illustrates the horizontal parity and Table 3 illustrates diagonal parity.

TABLE 2

| Horizontal parity | | | | | |
| --- | --- | --- | --- | --- | --- |
| a | a | a | a | a | a |
| b | b | b | b | b | b |
| c | c | c | c | c | c |
| d | d | d | d | d | d |

TABLE 3

| Diagonal parity | | | | | |
| --- | --- | --- | --- | --- | --- |
| a | S | d | c | b | a |
| b | a | S | d | c | b |
| c | b | a | S | d | c |
| d | c | b | a | S | d |

Looking at the diagonal parity Table 3, when S=1, the resulting parity is odd, and when S=0, the resulting parity is even, for all diagonals. It is this use of the value of S that enables the code to have a Hamming distance $d_H=3$, and to maintain a Maximum Separable Distance (MSD) condition. Without the value S, the code would have $d_H=2$, and only one erasure could be corrected.

Note that these characteristics apply only when m is a prime number. To use a value of m that is not prime, requires the block to be padded with zeroes, up to the prime value closest to m. Alternatively, the symbol representation can be padded with zeroes up to the length of m−1 bits per symbol while using blocks of length m.

The Even Odd decoding algorithm for the correction of two erasures will now be described in more detail. There are 4 unique decoding cases and each has its own procedure associated therewith.

1. Both Errors in Parity Symbols

In this case, the correction operation is exactly the same as the encoding operation.

2. One Error in a Data Symbol ($a_k$) and One in the Diagonal Parity Symbol (DP)

The $a_k$ symbol is corrected using the horizontal parity (HP) symbol in accordance with $$a_k = a_k \oplus HP \tag{10}$$

The diagonal parity (DP) symbol is restored in accordance with the encoding procedure described above.

$$a_{l,m+1} = S \oplus \left( \bigoplus_{t=0}^{m-1} a_{\langle l-t \rangle m,t} \right) \tag{9}$$

While S is defined according to the information symbols $$S = \bigoplus_{t=0}^{m-1} a_{m-1-t,t} \tag{7}$$

3. One Error in the Data Symbol $a_k$ and One Error in the Horizontal Parity (HP) Symbol In accordance with the original EVENODD method, the $a_k$ symbol is corrected using diagonal parity DP in accordance with:

$$a_{i,k} = S \oplus a_{\langle k-1 \rangle m, m+1} \oplus \left( \bigoplus_{\substack{t=0 \\ t \neq k}}^{m-1} a_{\langle k+i-t \rangle m,t} \right) \tag{11}$$

While S is defined in accordance with $$S = a_{\langle k-1 \rangle m, m+1} \oplus \left( \bigoplus_{t=0}^{m-1} a_{\langle k-t-1 \rangle m,t} \right) \tag{12}$$

The HP symbol is restored using the encoding procedure $$a_{l,m} = \bigoplus_{t=0}^{m-1} a_{l,t} \tag{8}$$

In accordance with the present invention, am improvement comprises correcting $a_k$ using m cyclic shifts, each time for a different symbol, and for each XOR of m bits. For this purpose, the characteristic derived from the definition of DP is utilized: k left shifts of DP will cause the DP bits to be inline with the bits that effect them in $a_k$. For example, suppose m=6 and k=3. The block before shifting looks like the following:

TABLE 4

The block before shifting

| DP | HP | 6 | 5 | 4 | 3 | 2 | 1 | 0 |
|---|---|---|---|---|---|---|---|---|
| 5 |   | S | 0 | 1 | 2 | 3 | 4 | 5 |
| 4 |   | 5 | S | 0 | 1 | 2 | 3 | 4 |
| 3 |   | 4 | 5 | S | 0 | 1 | 2 | 3 |
| 2 |   | 3 | 4 | 5 | S | 0 | 1 | 2 |
| 1 |   | 2 | 3 | 4 | 5 | S | 0 | 1 |
| 0 |   | 1 | 2 | 3 | 4 | 5 | S | 0 |
| S |   | 0 | 1 | 2 | 3 | 4 | 5 | S |

One can see that after three left shifts of DP, a similar pattern will form in the DP and in $A_3$. The block after shifting looks like the following:

TABLE 5

The block after shifting

| DP | HP | 6 | 5 | 4 | 3 | 2 | 1 | 0 |
|---|---|---|---|---|---|---|---|---|
| 2 |   | S | 0 | 1 | 2 | 3 | 4 | 5 |
| 1 |   | 5 | S | 0 | 1 | 2 | 3 | 4 |
| 0 |   | 4 | 5 | S | 0 | 1 | 2 | 3 |
| S |   | 3 | 4 | 5 | S | 0 | 1 | 2 |
| 5 |   | 2 | 3 | 4 | 5 | S | 0 | 1 |
| 4 |   | 1 | 2 | 3 | 4 | 5 | S | 0 |
| 3 |   | 0 | 1 | 2 | 3 | 4 | 5 | S |

Therefore, if we mark $$\overset{3}{\underset{\leftarrow}{A}}$$

to be symbol A shifted left 3 cyclic shifts, symbol $A_k$ is corrected by DP according to $$A_k = A_k \oplus \overset{k}{\underset{\leftarrow}{D}} \oplus S,$$

and symbol HP is corrected using the encoding procedure, once $A_k$ is corrected. Using this method, only k shifts of the same symbol and one XOR operation are required, resulting in significant reductions in time and hardware resources, considering that this procedure is repeated many times.

Both Errors in Data Symbols ($a_j$, $a_j$)

This is the most important case of the four. The symbol restoration in this case is recursive, but can also be performed explicitly by undoing the recursion. Assume the indices of the symbols with errors are i,j.

A. Define $a_{m-1,t} = 0$ for $0 \leq t \leq m+1$ and thus $$S = \left( \sum_{t=0}^{m-2} a_{t,m} \right) \oplus \left( \sum_{t=0}^{m-2} a_{t,m+1} \right) \tag{13}$$

B. The horizontal syndromes are then calculated $0 \leq u \leq m-1$ $$S_u^{(0)} = \sum_{\substack{t=0 \\ t \neq i,j}}^{m} a_{u,t} \tag{14}$$

and then the diagonal syndromes $$S_u^{(1)} = S \oplus a_{u,m+1} \oplus \left( \sum_{\substack{t=0 \\ t \neq i,j}}^{m-1} a_{\langle u-t \rangle m,t} \right) \quad (15)$$

C. The value S is then updated using the following $$S \leftarrow <-(j-i)-1>m \quad (16)$$

D. Then, $a_{s,i}$; $a_{s,j}$ are updated using $$a_{s,j} \Leftarrow S_{\langle j+s \rangle m}^{(1)} \oplus a_{\langle s+j-i \rangle m,i} \quad (17)$$
$$a_{s,i} \Leftarrow S_s^{(0)} \oplus a_{s,j}$$

E. The value S is then updated again using $$S \leftarrow <S-(j-i)>m \quad (18)$$

The restoration process is complete when S=m−1. Otherwise, the method continues with step D.

The application of the decoding method of the present invention to the EOP erasure correcting code will now be described in more detail. As in the first embodiment described above, the method implements the reduction in the number of test symbol possibilities to K=2. Thus, the largest metric and the second largest metric are used. The code is combined with the use of M'ary bi-orthogonal modulation such as the CSK modulation scheme described hereinabove with one sign bit transmitted in the phase of the symbol. The sign bit is designated as the msb of the received symbol.

Figure 3:
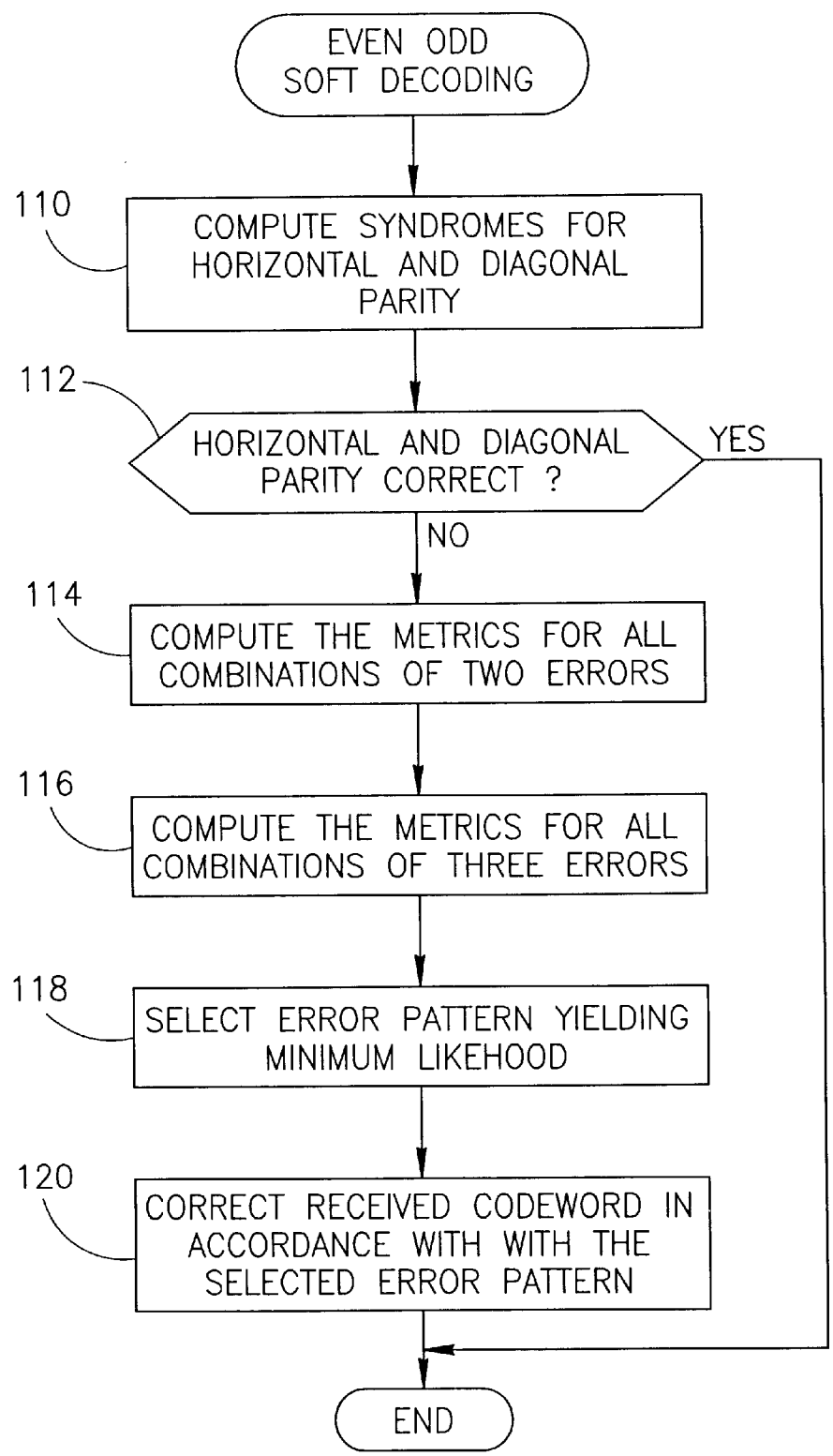
FIG. 3 is a flow diagram illustrating the Even Odd Parity soft decoding method of the present invention.

A flow diagram illustrating the Even Odd Parity soft decoding method of the present invention is shown in FIG. 3. To correct the errors, the syndromes are first calculated, including both diagonal and horizontal (step 110). If the syndromes are not equal to zero (step 112), the decoding method is performed in two steps: (1) assumption of two errors in a codeword with correction applied according to the parity symbols and calculation of the metrics of each possibility (step 114); and (2) assumption of three errors in a codeword, correction of the first error is done according to the second largest correlation peak, subsequent correction of the other two errors using the parity symbols (altogether 105–360 possibilities) and calculation of the metrics of each possibility (step 116).

The most likely error pattern is then chosen using the maximum likelihood algorithm described above, i.e. the error pattern yielding the minimum metric is chosen (step 118). The symbol is then corrected according to the error pattern using the above method (step 120).

The principal operation of the Information Set Decoding (ISD) described herein is to calculate the likelihood of different sets of information and choose the most likely set according to a certain likelihood function, i.e. the maximum likelihood algorithm.

In the case of the code of the present invention, the correlation represents the likelihood function. Different sets of information are chosen by selecting the various possibilities for one, two or three errors per block in which a parity error occurred.

The calculation of the information sets is done in accordance with the number of errors assumed in a received block. For two assumed errors, the errors are corrected in accordance with the Even Odd Parity erasure correction code procedure. For three assumed errors, one error is first assumed to be the second maximum correlation value while the remaining two errors are corrected using the procedure above for two assumed errors.

The metrics are calculated according to the particular type of transmission, i.e. signed (bi-orthogonal) or unsigned. For each received symbol, five parameters are stored in memory:

1. The symbol decoded in accordance with the first maximum in the correlation data (data1).
2. The absolute value of the first maximum value in the correlation data (max1).
3. The symbol decoded in accordance with the second maximum in the correlation data (data2).
4. The absolute value of the second maximum value in the correlation data (max2).
5. All the legitimate correlation values for the received symbol (corr).

The $i^{th}$ symbol is corrected according to the Even Odd Parity code from data1 to X for, for example:

Unsigned with 64 phases:

$$\text{metric}=\text{max1}(i)-\text{corr}(i*64+X) \quad (19)$$

Signed with 32 phases:

$$\text{metric}=\text{max1}(i)-\text{corr}(i*32+X \bmod 32)*\text{sign2}(X) \quad (20)$$

When i=0:8

$$\text{sign2}(x) = \begin{cases} 1, & 0 \leq x < 32 \\ -1, & 32 \leq x \leq 63 \end{cases} \quad (21)$$

The metric of correction of symbol i according to second maximum:

$$\text{metric}=\text{max1}(i)-\text{max2}(i)$$

The $i^{th}$ symbol is then corrected according to the second maximum:

Unsigned:

$$\text{metric}=\text{max1}(i)-\text{abs}(\text{corr}(i*32+\text{data2}(i))) \quad (22)$$

Signed:

$$\text{metric}=\text{max1}(i)-\text{abs}(\text{corr}(i*32+\text{data2}(i) \bmod(32))) \quad (23)$$

For each possible combination of errors in a received block, the sum of the metrics for each possible set of symbol corrections is calculated. The set yielding the lowest sum of metrics is the one that is selected to be corrected. In this fashion, the error pattern most likely to have occurred is chosen. Once the set is chosen out of all the possible sets of one, two and three errors per received block, the block is corrected in accordance with the chosen error pattern using the above described methods.

The following pseudo code shown in Listing 4 below illustrates the encoding method of the EOP code in more detail. The encoding method is performed in the transmitter.

Listing 4: Encoding Method: Even Odd Parity Code

```
void encode_block(block data_block_double)
{
        int S;      // main diagonal - determines even/odd parity of DP.
        int HP=0;   // Horizontal Parity.
        int DP=0;   // Diagonal Parity.
        int i;
        block_int data_block;
        for (i=0; i<block_len-2; i++) // calculate Parity symbols.
                {
                        data_block[i]*=2;         // add '000...0' on the m-1 line.
                        HP^=data_block[i];        // calculate Horizontal Parity.
                        DP^=data_block[i];        // calculate Diagonal Parity (Even).
                        rol(DP);                  // rotate left one bit -"-
                        data_block[i]/=+2;        // remove '000...0' from the m-1 line.
                }
        HP /= 2;                          // remove '0' from the m-1 line.
        S=DP&1;                           // get S value - should be on LSB of DP.
        DP ^= ((2*PHASES-1)*S);           // change DP to Odd Parity if S=1.
        DP >>= 1;
        data_block[i]=HP;
        data_block[i+1]=DP;
}
```

The following pseudo code shown in Listing 5 below illustrates the decoding method of the EOP code in more detail. The decoding method is performed in the receiver.

Listing 5: Decoding Method: Even Odd Parity Code

```
// Receiver Demodulator (1 block at a time) - HARD DECISION
void demod_block  (corr_matrix Rx_in, corr_matrix corr, block data_block,
                   block data2_block, block max1, block max2, block max2_metric,
                   FILE * corr2)
{
int i, j;
double value, addr, index 1=-1, index2 = -1;
cnt+=1;
for (i=0; i<block_len; i++)
  {
      max1[i]=0;         // 1st max value.
      max2[i]=0;         // 2nd max value.
      data_block[i]=0;   // symbol decoded by 1st max.
      data2_block[i]=0;  // symbol decoded by 2nd max.
      max2_metric[i]=0;  // 2nd max metric
      index1=100;        // 1st max index
      index2=100;        // 2nd max index
      for (j=0; j<N; j++)
         {
           corr[i][j]=pow(Rx_in[i][j],2)*sign2(Rx_in[i][j]);
           addr=j;
           if (fabs(value)>max1[i])
             {
               max2[i]=max1[i];                    // update max2 with max1.
               max1[i]=fabs(value);                // update max1.
               index2=index 1;
               index1=addr+N*(1-sign2(value))/2;   // save max1 location.
             }
           else if (value>=max2[i])
             {
               max2[i]=fabs(value);                            // update max2.
               index2=addr+N *(1-sign2(value))/2;   // save max2 location.
             }
         }
      data_block[i]=index1;
      data2_block[i]=index2;
      max2_metric[i]=max1[i]-max2[i];
  }
}
// EOD correction mechanism
int fix_one_error(block source_double)
{
```

Listing 5: Decoding Method: Even Odd Parity Code

```
        int i, S, tst=0, err_index = -2, tmp=0;
        int H, original_H                    // Horizontal syndrome.
        int D0, D1;                          // Diagonal syndrome(even/odd).
        int HP=0;                            // Horizontal Parity.
        int DP=0;                            // Diagonal Parity.
        block_int source;
        for (i=0; i<block_len-2; i++)        // calculate Parity symbols.
            {
            source[i] *= 2;                  // add '000...0' on the m−1 line.
            HP ^= source[i];                 // calculate Horizontal Parity.
            DP ^= source[i];                 // calculate Diagonal Parity (Even).
            rol(DP);                         // rotate left 1 bit -"-
            source[i] /= 2;                  // remove '000...0' from the m−1 line.
            }
        S=DP&1;                              // get S value - should be on LSB of DP.
        DP^=((2*PHASES−1)*S);                // change DP to Odd Parity if S=1.
        H=HP^(source[7]*2);
        original_H=H>>1;
        D0=DP^(source[8]*2);
        D1=(2*PHASES−1)^D0;
        tst=sign(H);
        tst*=2;
        tst+=sign(D0);
        i=0;
        switch (tst)
        {
            case 0 : err_index = −1;         // No error.
                break;
            case 1 : err_index = 8;          // DP error only.
                DP >> = 1;                   // remove 0 from LSB.
                tmp=source[8];
                source[8]=DP;                // correct error...
                break;
            case 2 : err_index= 7;           // HP error only.
                HP>>=1;                      // remove 0 from LSB.
                mp=source[7];
                source[7]=HP;                // correct error...
                break;
            case 3 : i=0;
                while (H!=D0 && H!=D1 && i<block_len)
                {
                    ror(H);                  // rotate right.
                    i++.
                }
                err_index=i;
                if (i<block_len)             // if not non correctable error.
                {
                    tmp=source[i];
                    source[i]^=original_H;   // correct error according to source's HP
                }
                break;
            default: err_index = −2;         // not a valid case - indicates an ERROR!
        }
        return(err_index);
    }
}
void fix_DS_and_HP(block source_double, int DS_index)     //DS = Data Symbol
    int S=0, i, k, D=0, HP=0;
    block_int source;
    k=DS_index
    for (i=0; i<block_len-2; i++)            // calculate Parity symbols.
        {
        source[i]*=2;                        // add '000...0' on the m−1 line.
        D^=source[i];                        // calculate Diagonal syndrome.
        rol(D);                              // calculate Diagonal syndrome.
        source[i] /= 2;                      // remove '000...0' from the m−1 line.
        }
    D^=(source[8]*2);                        // calculate Diagonal syndrome.
    S=get_bit2(D,mod((k−1),m),7);            // bit k−1 on syndrome is independent on symbol k.
    D^=((2*PHASES−1)*S);                     // adjust to even/odd parity.
    i=0;
    while (i<k)                              // bring error indicator('1' on D) to relevant line.
    {
        rol(D);
        i++;
    }
    source[k]=((source[k]*2)^D)>>1;          //correct symbol k.
    for (i=0; i<block_len-2; i++) HP^=source[i];     // calculate Horizontal Parity.
```

-continued

Listing 5: Decoding Method: Even Odd Parity Code

```
        source[7]=HP;
}
void fix_two_DS(block source_double int DS1_index, int DS2_index)
{
        int i, j, t, S=0, s1, s2, k, k1, k2;
        bit_matrix_int tmp;
        ext_bit_matrix_int src;
        int Hi=0, Di=0;              // Horizontal syndrome.
        ext_bit_vector_int H,D;
        block_int source;
        i=DS1_index;
        j=DS2_index;
        source[i]=0;
        source[j]=0;
        int_to_bit(source, tmp);
        extend(tmp, src);
    for (t=0; t<block_len-2; t++)    // calculate Parity symbols.
        {
                source[t]*=2;            // add '000...0' on the m-1 line.
                Hi^=source[t];           // calculate Horizontal Parity.
                Di^=source[t];           // calculate Diagonal Parity (Even).
                rol(Di);
                source[t] /= 2;          // remove '000...0' from the m-1 line.
        }
        s1=in_xor(source[7]);        // get S value-xor of 2 parity symbols (xor on all symbol
bits).
        s2=int_xor(source[8]);
        S=s1^s2;
        Di ^= ((2*PHASES-1)*S);      // change DP to odd Parity if S=1.
        Hi=Hi^(source[7]*2);
        int_to_vec(Hi,H,7);
        Di=Di^(source[8]*2);
        int_to_vec(Di,D,7);
        k=mod((-(j-i)-1), m);
        while (k<(m-1))
        {
            k1=mod((j+k), m);
            k2=mod((k+(j-i)), m);
            src[j][k]=D[k1]^src[i][k2];
            src[i][k]=H[k]^src[j][k];
            k=mod((k-(j-i)), m);
        }
        reduce(src, tmp);
        bit_to_int(tmp, source);
}
void fix_HP_and_DP(block source)
{
        encode_block(source);
}
void fix_DS_and_DP(block source_double, int DS_index)
{
        int i, k, S, H=0;
        block_int source;
        k=DS_index;                  // for easy use in code
        for (i=0; i<block_len-1; i++)  // calculate Horizontal syndrome
        {
            H ^= source[i];          // calculate Diagonal Parity (Even).
        }
        source[k]^= H;               // fix Ds according to HP.
        source[8]=0;
        for (i=0; i<block_len-2; i++)  // calculate DP.
        {
            source[i] *= 2;          // add '000...0' on the m-1 line.
            source[8] ^= source[i];  // calculate Diagonal Parity (Even).
            rol(source[8]);
            source[i] /= 2;          // remove '000...0' from the m-1 line.
        }
        S=source[8]&1;               // get S value - should be on LSB of DP.
        source[8] ^= ((2*PHASES-1)*S);  // change DP to Odd Parity if S=1.
        source[8] >>= 1;
}
// FIX 2 ERRORS - contain all above procedures
void fix_two_errors(block source, int err1, int err2)
{
        int DS;
        if ((err1==7 && err2==8) || (err1==8 && err2==7))
        {
```

Listing 5: Decoding Method: Even Odd Parity Code

```
                    fix_HP_and_DP(source);
            }
            if ((err1==7 && err2<7) || (err1<7 && err2==7))
            {
                    DS=get_min(err1 ,err2);
                    fix_DS_and_HP(source, DS);
            }
            if ((err1==8 && err2<7) || (err1<7 && err2==8))
            {
                    DS=get_min(err1,err2);
                    fix_DS_and_DP(source,DS);
            }
            if (err1<7 && err2<7)
            {
                    fix_two_DS(source,err1,err2);
            }
    }
}
// DECODER (1 block) - SOFT DECISION
int decode_block     (block source, corr_matrix corr, block data2_block, block max1
                      block max2, block max2_metric)
{
            int i, j, k, err_index=-2, DS, two_errors_found=0;
            int index1 = -1, index2=-1, index3=-1;
            block tst1, tst2, tst3, tmp;
            double min_metric, metric, metric2;
            copy_block(source, tst1);
            err_index=fix_one_error(tst1);     // try to fix one error.
            if (err_index!=-1)                 // found parity error.
            {
                min_metric=1000;
                if (err_index>-1 && err_index<block_len) // found 1 error...
                {
                        metric=get_metric(err_index, err_index, tst1, corr,max1);
                        min_metric=metric;
                        index1=err_index;
                }
                for (i=0; i<block_len-1; i++)       // fix two errors.
                    for (j=block_len-1;j>i;j--)
                    {
                       copy_block(source, tst2);
                       fix_two_errors(tst2, i, j);
                       metric=get_metric(i, j, tst2, corr, max1);
                       if (metric<min_metric)        // case i, j errors are ML.
                       {
                            min_metric=metric;
                            index1=i;
                            index2=j;
                       }
                    }
                for (k=0; k<block_len; k++)         // fix 3 errors.
                {
                    copy_block(source, tmp);
                    tmp[k]=data2_block[k];          // fix according to 2nd max.
                    metric2=max2_metric[k];         // 2nd max metric
                    for (i=0; i<block_len-1; i++)   // fix two errors.
                    {
                        for (j=block_len-1; j>i;j--)
                        {
                            if (i!=k && j!=k)
                            {
                                copy_block(tmp, tst3);
                                fix_two_errors(tst3, i, j);
                                metric=metric2;
                                metric+=get_metric(i, j, tst3, corr,max1);
                                if (metric<min_metric) // case i, j errors are ML.
                                {
                                        min_metric=metric;
                                        index1=i;
                                        index2=j;
                                        index3=k;
                                }
                            }
                        }
                    }
                }
                if (index2<0)            // case 1 error is ML
                {
```

-continued

Listing 5: Decoding Method: Even Odd Parity Code

```
            fix_one_error(source);    // one error metric is ML.
            //printf("\nfound 1 errors in %d.",index1);
        }
        else
            if(index3<0)              // case 2 errors is ML
            {
                fix_two_errors(source, index1, index2); // two metric errors -ML.
                //printf("\nfound 2 errors : %d,%d.", index1, index2);
            }
            else      // case 3 errors is ML
            {
                //printf("\nfound 3 errors: %d, %d, %d", index1, index2, index3);
                source[index3]=data2_block[index3];   // fix according to 2nd max.
                fix_two_errors(source, index1, index2); // fix other 2 errors.
            }
    }
    else
        //printf("\nfound no errors");
    return(index1);     //if index 1<0 - no errors found, if 9 - 2/3 errors found.
}
```

Note that alternatively, the soft decoding method of the present invention can be modified to further reduce the number of computations required by choosing which codewords to look at during the search. For example, only those codewords determined to be the most likely received codewords are examined during the search. The codewords can be chosen using a decoder suitably adapted to perform the well known Chase algorithm which provides a method of performing the search for the optimum codeword. Additional details on the Chase algorithm can be found in Section 4.4 of "Error-Correction Coding For Digital Communications," G. C. Clark, 1981, incorporated herein by reference.

In brief, the Chase algorithm is a technique for approximating the performance of a maximum likelihood sequence estimator. First, a hard decision is made on each symbol in the received sequence. Then, various patterns of errors are deliberately introduced so as to generate a plurality of test sequences. Each sequence created is then decoded using a hard decision decoder. The distance from each of the codewords to the received sequence is then generated, and the codeword closest thereto is chosen. The algorithm takes advantage of the fact that when the hard decision decoded word is not the correct choice, then one of its nearest neighbors usually is.

Hardware Implementation of the Soft Decoder

Figure 4:
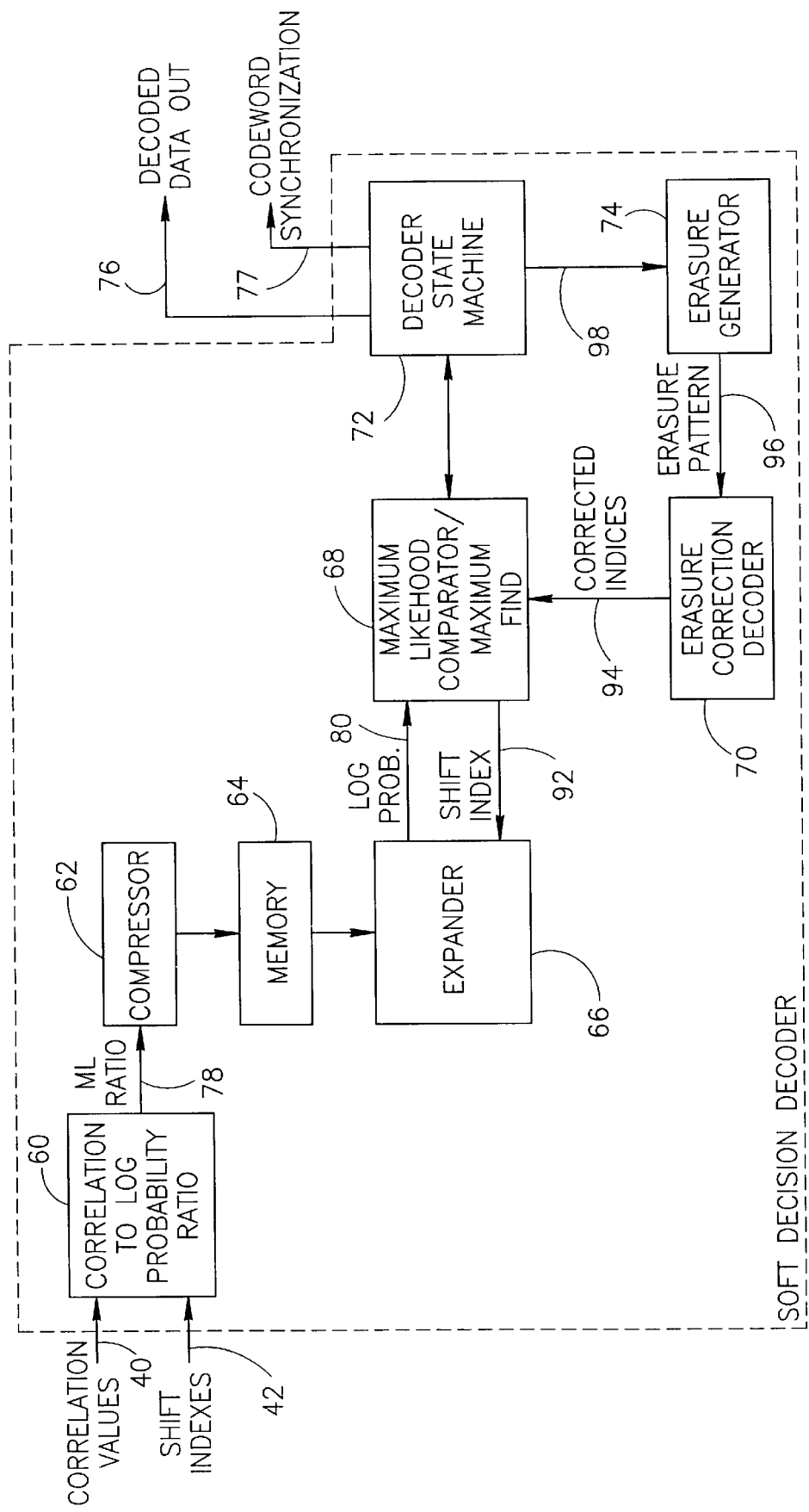
FIG. 4 is a block diagram illustrating an example implementation of the soft decision decoder of the present invention.

A block diagram illustrating an example implementation of the soft decision decoder of the present invention is shown in FIG. 4. The following implementation is presented as an example only and is not intended to limit the scope of the invention. One skilled in the electrical arts can construct other encoding and decoding circuits that utilize the soft decoding method of the present invention. The example presented herein can be implemented using hardware and/or software. It is particularly suited for implementation in hardware circuitry within an ASIC.

The soft decision decoder, generally referenced 44, comprises a plurality of functional blocks that are substantially mutually independent from each other, each functional block being responsible for a task in the soft decision decoding scheme of the present invention. In general, the soft decision decoder is operative to perform iterative erasure correcting for each possible combination of erasures in a given codeword.

The correlation values 40 and shift indexes 42 are input to module 60. This module is operative to convert the correlation value to a log probability ratio (maximum likelihood). The output is a maximum likelihood ratio value 78 that is input to the compressor 62. Depending on the amount of chip or board real estate available, the compressor and expander modules may be used to reduce the amount of memory required to perform the soft decision decoding method.

The maximum likelihood ratios may optionally be compressed by averaging every p values, where p=2, 3, 4, etc. (i.e. integration). Preferably, the maximum value (i.e. the peak) is preserved while the other maximum likelihood ratio values (i.e. correlation values) are compressed. The compressed values are stored in the memory (i.e. RAM) 64 and decompressed by expander 66 before being processed. The shift index 92 provided by module 68 is used as the lookup for the expander. The output of the expander, the log probability 80, is input to the maximum likelihood comparator and maximum search module 68.

The erasure generator module 74 comprises counting means adapted to run over all possible erasure combinations and to generate and output an erasure pattern 96 for each combination. The number of erasures depends on the erasure correcting code used, e.g., 1 symbol in the case of SDP or 2 symbols in the case of EOP. The erasure generator module 74 receives control information from the decoder state machine 72 which is operative to provide the control and synchronization to the modules in the decoder 44.

The erasure correction decoder module 70 is adapted to perform the particular erasure correcting code chosen for the soft decision decoder. Examples include the Soft Diagonal Parity code and the Even Odd Parity Code described hereinabove. Note that an upper bond for the decoding delay time is the codeword time divided by the number of possible erasure combinations. The output of the erasure correction decoder comprises the corrected indexes 94 which are input to the maximum likelihood comparator and maximum search module 68.

In accordance with the corrected erasure, module 68 is operative to compute the maximum likelihood for the codeword with the corrected erasure. The difference between the new likelihood and the current maximum likelihood for the current symbol is calculated. The current likelihood is made the new maximum if it exceeds the current maximum. Thus, the module 68 is operative to track the maximum likelihood from among the likelihoods calculated for each erasure combination tested. The most likely codeword is subsequently decoded by the decoder state machine 72 and the decoded data 76 is output to the next processing stage, e.g., the MAC layer processor. An indication of the codeword synchronization 77 is also generated and output by the decoder state machine 72.

Figure 5:
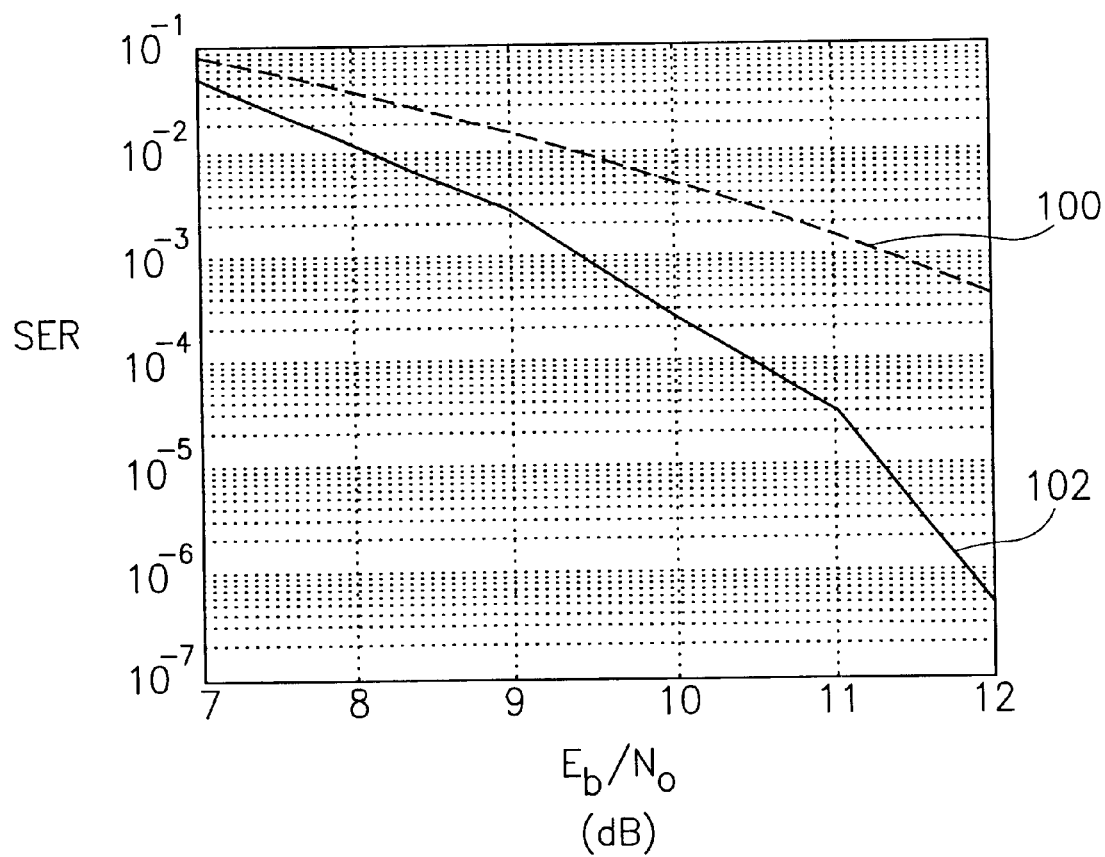
FIG. 5 is a graph illustrating the difference in Symbol Error Rate (SER) with and without the use of the decoding method of the present invention.

A graph illustrating the difference in Symbol Error Rate (SER) with and without the use of the decoding method of the present invention is shown in FIG. 5. The Soft Diagonal Parity coding scheme was used with the decoding method of the present invention in generating the data for this graph. Both curves were generated by simulating the transmission of 10,000 blocks with added noise, each block comprising six data symbols and one parity symbol, each symbol comprising seven bits. The energy to noise ratio is plotted with respect to the symbol error rate. The dashed curve 100 represents the performance achieved without any soft decision error correction code. The solid curve 102 represents the performance achieved with the soft decision decoding method of the present invention. The graph illustrates a significant improvement in performance with use of the decoding method. For example, at an energy to noise ratio of 11 dB, the SER without soft decoding is approximately $2 \times 10^{-3}$ while the SER with soft decoding is approximately $3 \times 10^{-5}$, almost two orders of magnitude less.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of soft decoding capable of correcting b+1 errors using a block erasure correcting code with the ability to correct b erasures, said method comprising the steps of:
   receiving for each symbol in a block of n symbols, a hard decision metric and a set of symbol metrics wherein each possible symbol value has a metric associated therewith;
   looping through all symbols in said block; and for each symbol;
   assuming said symbol is in error;
   testing K possible symbol values looping through all possible combinations of b symbols from among remaining symbols that have not yet been assumed in error, and for each combination of b symbols;
   marking said combination as erasures;
   correcting said erasures using said erasure correcting code;
   calculating a likelihood of a resulting codeword;
   selecting a codeword having a maximum likelihood associated therewith; and
   wherein n, K and b are positive integers.

2. The method according to claim 1, wherein said step of calculating the likelihood comprises calculating the difference between the symbol metric and the corresponding hard decision metric.

3. The method according to claim 1, wherein said erasure correcting codecomprises a Soft Diagonal Parity (SDP) code.

4. The method according to claim 3, wherein said Soft Diagonal Parity code comprises the steps of:
   arranging a block of n–1 data symbols, each data symbol comprising n bits;
   calculating a parity bit for each diagonal in said block; and
   appending a resulting set of parity bits as the $n^{th}$ symbol of said block.

5. The method according to claim 1, wherein said erasure correcting code comprises the step of calculating a parity bit for each diagonal in a block of n–1 data symbols, each data symbol comprising n bits, wherein resulting parity bits are transmitted as the $n^{th}$ symbol of said block.

6. The method according to claim 1, wherein said erasure correcting code comprises an Even Odd Parity (EOP) code.

7. The method according to claim 6, wherein said Even Odd Parity code comprises the steps of:
   computing a horizontal parity syndrome and a diagonal parity syndrome; and if horizontal parity and diagonal parity are not correct,
   computing metrics for all combinations of two symbol errors;
   computing metrics for all combinations of three symbol errors;
   selecting an error pattern that yields a minimum likelihood; and
   correcting said block in accordance with said selected error pattern.

8. The method according to claim 1, wherein the number K of possible symbol values to test for each symbol comprises a number smaller than a total number of possible symbol values.

9. The method according to claim 1, wherein the number K of possible symbol values to test for each symbol is two.

10. The method according to claim 1, wherein the number K of possible symbol values to test for each symbol is three.

11. The method according to claim 1, wherein the likelihood values provided for each symbol in said block comprise correlation sums and wherein said hard decision corresponds to a symbol value associated with a maximum correlation sum.

12. The method according to claim 1, wherein said set of likelihood values provided for each symbol in said block comprises a set of correlation sums provided by a Code Shift Keying (CSK) based receiver wherein each possible shift index has a correlation sum associated therewith, said hard decision equal to a shift index associated with a maximum correlation sum.

13. A full information set soft decision decoder for correcting b+1 errors using a block erasure correcting code with the ability to correct b erasures, comprising:
   a receiving mechanism adapted to receive for each symbol in a block of n symbols, a set of likelihoods wherein each possible symbol value has a likelihood associated therewith, and a hard decision equal to the symbol value corresponding to a maximum likelihood;
   a converter for converting likelihoods values to log probability ratios;
   an erasure generator adapted to generate all possible combinations of erasure patterns;
   an erasure correction decoder adapted to correct said block in accordance with each erasure pattern generated;
   a likelihood generator for calculating a likelihood of a resulting codeword corresponding to each possible combination of erasure pattern utilizing said log probability ratios;

search means for determining a codeword yielding a maximum likelihood; and a decoder mechanism operative to decode said codeword corresponding to a maximum likelihood.

14. The decoder according to claim 13, wherein said erasure correction decoder is adapted to implement Even Odd Parity decoding.

15. The decoder according to claim 13, wherein said erasure correction decoder is adapted to implement Soft Diagonal Parity decoding.

16. The decoder according to claim 13, further comprising:

compressor means adapted to compress the log probability ratio values output from said converter;

a memory adapted to store said compressed log probability ratio values; and expander means adapted to expand said compressed log probability ratio values.

17. A method of soft decoding capable of correcting b+1 errors using a block erasure correcting code with the ability to correct b erasures, said method comprising the steps of:

receiving a hard decision metric and a symbol metric for all possible values of each symbol in a codeword;

assuming a single error in each symbol location; and for each symbol, calculating a first metric difference between a symbol metric for a first trial symbol and said hard decision metric;

assuming b erasures in said codeword; and for each erasure, correcting said erasures using said erasure correcting code;

calculating a second metric difference between a symbol metric for a second trial symbol and said hard decision metric;

summing said second metric differences and said first metric difference to yield a sum of differences;

selecting a codeword yielding a minimum sum of differences; and wherein b is as positive integer.

18. The method according to claim 17, wherein K possible symbol values are tested for each of said b symbols, wherein K is a positive integer less than a total number of possible symbol values.

19. The method according to claim 17, wherein said erasure correcting code comprises a Soft Diagonal Parity (SDP) code.

20. The method according to claim 17, wherein said erasure correcting code comprises the step of calculating a parity bit for each diagonal in a block of n−1 data symbols, each data symbol comprising n bits, wherein resulting parity bits are transmitted as the $n^{th}$ symbol of said block.

21. The method according to claim 17, wherein said erasure correcting code comprises an Even Odd Parity (EOP) code.

22. The method according to claim 17, wherein the number K of possible symbol values to test for each symbol is two.

23. The method according to claim 17, wherein the number K of possible symbol values to test for each symbol is three.

24. The method according to claim 17, wherein the metric values symbol metrics provided for each symbol comprise correlation sums and wherein said hard decision corresponds to a symbol value associated with a maximum correlation sum.

25. The method according to claim 17, wherein said set of metric values provided for each symbol comprises a set of correlation sums provided by a Code Shift Keying (CSK) based receiver wherein each possible shift index has a correlation sum associated therewith, said hard decision equal to a shift index associated with a maximum correlation sum.

26. A method of generating a soft decision error correcting code, said method comprising the steps of:

initializing a parity symbol;

receiving a block of data comprising n−1 symbols; and for each symbol, XORing said symbol with said parity symbol;

rotating said parity symbol;

including a resultant parity symbol as an $n^{th}$ symbol in said block;

modulating said block of data and said soft decision error correcting code utilizing Code Shift Keying (CSK) modulation; and wherein n is a positive integer.

27. The method according to claim 26, wherein said modulation comprises unsigned Code Shift Keying (CSK) modulation.

28. The method according to claim 26, wherein said modulation comprises signed Code Shift Keying (CSK) modulation.

29. A method of generating a soft decision error correcting code, said method comprising the steps of:

initializing a horizontal parity symbol;

initializing a diagonal parity symbol;

receiving a block of data comprising a plurality of symbols; and for each symbol, XORing said symbol with said horizontal parity symbol;

XORing said symbol with said diagonal parity symbol;

rotating said diagonal parity symbol;

calculating an 'S' bit from said data block;

setting said diagonal parity symbol in accordance with said 'S' bit;

appending the resultant horizontal parity symbol to said block;

modulating said block of data and said soft decision error correcting code utilizing Code Shift Keying (CSK) modulation; and appending the resultant diagonal parity symbol to said block.

30. The method according to claim 29, wherein said modulation comprises unsigned Code Shift Keying (CSK) modulation.

31. The method according to claim 29, wherein said modulation comprises signed Code Shift Keying (CSK) modulation.

32. A communication apparatus coupled to a channel, comprising:

an encoder adapted to generate a soft decision code from a block of data received from a data source;

a transmitter operative to transmit data including said soft decision code over said channel;

a receiver operative to receive data from said communications channel and to generate a set of soft symbol metrics and a hard symbol metric for each symbol received;

a soft decoder adapted to decode said received data so as to yield the original transmitted symbols, said soft decoder operative to:

receive said hard decision metric and said set of symbol metrics;
assume a single error in each symbol location; and for each symbol,
calculate a first metric difference between the metric for a first trial symbol and said hard decision metric;
assume one or more erasures in said symbol; and for each erased symbol,
correct said erasures using an erasure correcting code;
calculate a second metric difference between the metric for a second trial symbol and said hard decision metric;
sum said second metric differences and said first metric difference to yield a sum of differences; and
select the codeword yielding a minimum sum of differences.

* * * * *